(12) United States Patent
Longstreet et al.

(10) Patent No.: US 9,851,400 B1
(45) Date of Patent: Dec. 26, 2017

(54) SYSTEM ON A CHIP SERIAL COMMUNICATION INTERFACE METHOD AND APPARATUS

(71) Applicant: Marvell International Ltd., Hamilton (BM)

(72) Inventors: Roger Longstreet, Cheyenne, WY (US); Vivek Raghunath Khanzode, Sunnyvale, CA (US); Hongying Sheng, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/050,179

(22) Filed: Feb. 22, 2016

Related U.S. Application Data

(63) Continuation of application No. 14/293,475, filed on Jun. 2, 2014, now Pat. No. 9,268,661, which is a continuation of application No. 14/072,620, filed on Nov. 5, 2013, now Pat. No. 8,762,608, which is a continuation of application No. 11/855,618, filed on Sep. 14, 2007, now abandoned.

(60) Provisional application No. 60/829,724, filed on Oct. 17, 2006, provisional application No. 60/825,659, filed on Sep. 14, 2006.

(51) Int. Cl.
| | |
|---|---|
| *G06F 13/12* | (2006.01) |
| *G01R 31/3177* | (2006.01) |
| *G06F 13/42* | (2006.01) |
| *G06F 13/16* | (2006.01) |
| *H03M 9/00* | (2006.01) |
| *G06F 13/38* | (2006.01) |

(52) U.S. Cl.
CPC ..... *G01R 31/3177* (2013.01); *G06F 13/4282* (2013.01); *G06F 13/1684* (2013.01); *G06F 13/385* (2013.01); *H03M 9/00* (2013.01)

(58) Field of Classification Search
None
See application file for complete search history.

(56) References Cited

U.S. PATENT DOCUMENTS

| | | | |
|---|---|---|---|
| 5,012,180 A | 4/1991 | Dalrymple et al. | |
| 5,153,509 A | 10/1992 | Dalrymple et al. | |
| 5,541,596 A | 7/1996 | Yoshida | |
| 5,777,567 A | 7/1998 | Murata et al. | |
| 5,987,562 A | 11/1999 | Glover | |
| 6,177,891 B1 | 1/2001 | Nakamura | |
| 6,178,056 B1 | 1/2001 | Cloke et al. | |
| 6,861,866 B2 * | 3/2005 | Han | G01R 31/31705 326/16 |
| 7,457,896 B1 | 11/2008 | Mount | |
| 7,457,986 B2 | 11/2008 | Larson et al. | |
| 2001/0050575 A1 | 12/2001 | Weng et al. | |
| 2002/0089714 A1 | 7/2002 | Shimoyama | |
| 2003/0088834 A1 * | 5/2003 | Murakami | G11B 5/012 360/39 |

(Continued)

*Primary Examiner* — Henry Tsai
*Assistant Examiner* — Aurangzeb Hassan (57) ABSTRACT

A system, apparatus, and method for testing blocks of a system on a chip (SOC) are described herein. An SOC, in accordance with various embodiments, may include a serial communication interface configured to multiplex, serialize, and/or parallelize signals streams from selected blocks of the SOC to an off-chip test unit through an off-chip serial communication interface. Other embodiments may be described and claimed.

19 Claims, 8 Drawing Sheets

(56) References Cited

U.S. PATENT DOCUMENTS

| | | |
|---|---|---|
| 2005/0207234 A1 | 9/2005 | Baechtold et al. |
| 2007/0024476 A1 | 2/2007 | Saeki et al. |
| 2007/0145993 A1 | 6/2007 | Li et al. |
| 2007/0279196 A1 | 12/2007 | Macaluso et al. |

\* cited by examiner

| Name | Type | Interface | Description |
|---|---|---|---|
| ISET | Analog Reference | ANALOG | The VSET reference input |
| RDX/RDY | Analog Input | ANALOG | Analog read/servo input |
| WRTP1/WRTM1 | Analog Output | ANALOG | Primary PECL write output |
| ABUFP/ABUFM | Analog Output | ANALOG | Analog buffer output |
| nWGOUT | Digital Output | ANALOG | R/nW signal for the preamplifier |
| HDACP/HDACM | Analog Output | ANALOG | High speed DAC output |
| FREFP_XIN | Analog Input | ANALOG | Ceramic/Crystal oscillator input |
| FREFM_XOUT | Analog Output | ANALOG | Ceramic/Crystal oscillator output |
| TST | Analog Output | ANALOG | Analog test point |
| OSC_CLK | Digital Output | DIG_MISC | Output of the reference clock generator |
| nRESET | Digital Input | DIG_MISC | Master hard reset for RDC |
| SDEN | Digital Input | DIG_SIF | Enable for the register access serial interface |
| SDCLK | Digital Input | DIG_SIF | Clock for the register access serial interface |
| SDATA | Digital I/O | DIG_SIF | Address/Data for the register serial interface |
| SGATE | Digital Input | DIG_MODE | To put the RDC into SERVO mode |
| RGATE | Digital Input | DIG_MODE | To put the RDC into READ mode |
| WGATE | Digital Input | DIG_MODE | To put the RDC into WRITE mode |
| SVD[2:0] | Digital Output | DIG_SERVO | Servo data interface. The SVD0 is the clock signal, others are data |
| NRZ[10:0] | Digital I/O | DIG_RW | The Data NRZ read/write interface |
| WCLK | Digital Input | DIG_RW | The clock for latching NRZ[10:0] into the RDC core during write |
| RCLK | Digital Output | DIG_RW | The clock for latching NRZ coming from the RDC |
| EF0 | Digital Output | DIG_RW | Error flag 0 |
| EF1 | Digital Output | DIG_RW | Error flag 1 |
| DSW_CLK/DLCK | Digital Output | DIG_RW | The DSW clock |

Fig. 5

| Name | Type | Interface | Description |
|---|---|---|---|
| SDEN2 | Digital Input | DIG_SIF2 | Enable for the register access serial interface SIF2 |
| SDCLK2 | Digital Input | DIG_SIF2 | Clock for the register access serial interface SIF2 |
| SDATA2 | Digital IO | DIG_SIF2 | Address/Data for the register serial interface SIF2 |
| WRTP2/WRTM2 | Output | ANALOG | Secondary PECL write output |
| DWRTP/DWRTM | Input | ANALOG | Direct PECL write input |

SYSTEM ON A CHIP SERIAL COMMUNICATION INTERFACE METHOD AND APPARATUS

CROSS-REFERENCES TO RELATED APPLICATIONS

The present disclosure is a continuation of and claims priority to U.S. patent application Ser. No. 14/293,475, filed Jun. 2, 2014, now U.S. Pat. No. 9,268,661, issued Feb. 23, 2016, which is a continuation of and claims priority to U.S. patent application Ser. No. 14/072,620, filed Nov. 5, 2013, now U.S. Pat. No. 8,762,608, issued Jun. 24, 2014, which is a continuation of and claims priority to U.S. patent application Ser. No. 11/855,618, filed Sep. 14, 2007, which is a non-provisional application of U.S. Provisional Patent Application No. 60/829,724, filed Oct. 17, 2006, and U.S. Provisional Patent Application No. 60/825,659, filed Sep. 14, 2006, which are incorporated herein in their entirety.

TECHNICAL FIELD

Embodiments of the present invention relate to the field of data processing and, in particular, to techniques for testing blocks of a system on a chip through a serial communication interface.

BACKGROUND

A typical storage system on a chip (SOC) device has many functional blocks, e.g., a read channel (RC) block, a hard disk controller (HDC) block; a processor block; and static random access memory block (SRAM). For testing the various blocks, the SOC may be programmed into various "personality" modes. When the SOC is programmed into a personality mode, the definition of digital pins change and the SOC behaves like a discrete device depending on the selected personality mode. In an RC-only mode, the definition of most of the digital pins is changed to pins defined for the RC interface (e.g., the Advanced Technology Attachment (ATA) pins for the normal mode are used as the RC non-return-to-zero (NRZ) pins). This is achieved by multiplexing the block level interface pins out to the SOC pins. While this technique may work for high pin count SOCs (e.g., parallel Advanced Technology Attachment (PATA) SOCs), it may present difficulties with respect to low pin count SOCs.

Current trends see the SOC pin count, and the driving capability of the pins themselves, reducing. For an enterprise class SOC, the RC inside can easily run at 2.5 gigahertz (GHz) (and faster for the future) and, therefore, the SOC pins need to be able to drive the complementary metal oxide semiconductor (CMOS) signals at approximately 250 megahertz (MHz). In low pin count SOCs, the interface pins are not capable of driving more than 50 MHz digital signals. Also, to provide for ten bits of NRZ data, at least twelve pins are needed, not counting the control interface. It is impractical for the low pin count SOC to spare so many pins.

SUMMARY OF THE INVENTION

In view of the challenges in the state of the art, embodiments of the invention are based on the technical problem of reducing the amount of electrical connections of a system on a chip (SOC) that are used for testing components of the SOC. An SOC, complementary interface, and test unit are provided as suitable to solve the problems upon which at least one embodiment of the invention is based.

More specifically, there is provided, a method in accordance with various embodiments, in an SOC having a control logic block, a processor block, and a serial communication interface, where the serial communication interface performs operations including receiving a parallel signal stream from a control logic block of the SOC, receiving a personality mode selection signal, and converting the parallel signal stream to a serial signal stream and transmitting the serial signal stream from the SOC based at least in part on the receiving of the personality mode selection signal.

In various embodiments where the control logic block includes a read channel block (RDC), the method may further include placing the SOC into a RDC-only personality mode, based at least in part on said receiving of the personality mode selection signal, to facilitate testing of the RDC.

In various embodiments the serial communication interface may perform the operation of transmitting the serial signal stream via a first serial port of the SOC, receiving a second serial signal stream via a second serial port of the SOC, converting the second serial signal stream to a second parallel signal stream, and transmitting the second parallel signal stream to the control logic block. The transmitting of the serial signal may include transmitting the serial signal stream via a pair of differential signal lines coupled to the first serial port.

Various embodiments may include SOCs that provide suitable solutions to at least some of the above identified challenges found in prior art SOCs. For example, an SOC of some embodiments may include a processor block, a control logic block, which may include an RDC and/or a hard disk controller block (HDC), to output a parallel signal stream, and a serial communication interface communicatively coupled to the control logic block and the processor block. The serial communication interface may receive the parallel signal stream, receive a personality mode selection signal, and convert the parallel signal stream to a serial signal stream and output the serial signal stream based at least in part on the personality mode selection signal.

In various embodiments, the SOC may comprise a non-return-to-zero (NRZ) bus communicatively coupled to the control logic block and the serial communication interface to transmit at least a portion of the first parallel signal stream from the control logic block to the serial communication interface.

In various embodiments, the serial communication interface may have an output serial port with a pair of differential electrical connections to output the serial signal stream. The serial communication interface may also have a parallel-to-serial block to convert the parallel signal stream to a serial signal stream. The parallel-to-serial block may include an encoder to encode the parallel signal stream and a transmit PHY block to modulate the encoded parallel signal stream as the serial signal stream for output via the output serial port.

The serial communication interface may have a input serial port with a pair of differential electrical connections to receive a serial signal stream. In these embodiments the serial communication interface may convert the received serial signal stream to a parallel signal stream, and transmit the parallel signal stream to the control logic block of the SOC.

In various embodiments, the serial communication interface may additionally receive a parallel signal stream from the processor block of the SOC, convert the processor block's parallel signal stream to serial signal stream and transmit the serial signal stream via the same output serial port used for transmitting the serial signal streams of the RDC and/or HDC.

The serial communication interface of the SOC of various embodiments may have means for receiving a parallel signal stream from the control logic, which may be the RDC and/or the HDC, means for receiving a personality mode selection signal, means for converting the parallel signal stream to a serial signal stream and transmitting the serial signal stream from the SOC based at least in part on said receiving of the personality mode selection signal.

In various embodiments, the serial communication interface may include means for placing the SOC into an RDC-only personality mode, based at least in part on said receiving of the personality mode selection signal, to facilitate testing of the RDC.

In various embodiments, the serial communication interface may include means for receiving a serial signal stream that originates from off the SOC, means for converting the received serial signal stream to a parallel signal stream, and means for transmitting the another parallel signal stream to the control logic block.

In various embodiments, a testing system for testing components of the SOC may also be described and claimed herein. This testing system may include a test unit to be communicatively coupled to an SOC. The test unit may include a controller to provide a personality mode selection signal to place the SOC into a selected personality mode for testing the control logic block of the SOC.

The testing system may also include a serial communication interface, external to the SOC, to be communicatively coupled to the SOC and to the test unit. The off-chip serial communication interface may transmit a plurality of signal streams between the SOC and the test unit through a serial interface provided to the SOC and a parallel interface provided to the test unit.

In various embodiments the off-chip serial communication interface may receive, from the SOC, a serial signal stream, convert the serial signal stream to a parallel signal stream, and transmit the parallel signal stream to the test unit via the parallel interface. The off-chip serial communication interface may additionally/alternatively receive, from the test unit, another parallel signal stream, convert the another parallel signal stream to another serial signal stream, and transmit the another serial signal stream to the SOC via the serial interface.

Other features that are considered as characteristic for embodiments of the present invention are set forth in the appended claims.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference in the specification to "one embodiment" or "an embodiment" means that a particular feature, structure, or characteristic described in connection with the embodiment is included in at least one embodiment. The appearances of the phrase "in one embodiment" in various places in the specification do not necessarily all refer to the same embodiment, but they may. The phrase "A/B" means A or B. The phrase "A and/or B" means (A), (B), or (A and B). The phrase "A, B, and/or C" means (A), (B), (C), (A and B), (A and C), (B and C) or (A, B and C). The phrase "(A) B" means (A B) or (B), that is, A is optional.

"Circuitry," as used in any embodiment herein, may comprise, for example, singly or in any combination, hardwired circuitry, programmable circuitry, state machine circuitry, and/or firmware that stores instructions executed by programmable circuitry.

Figure 1:
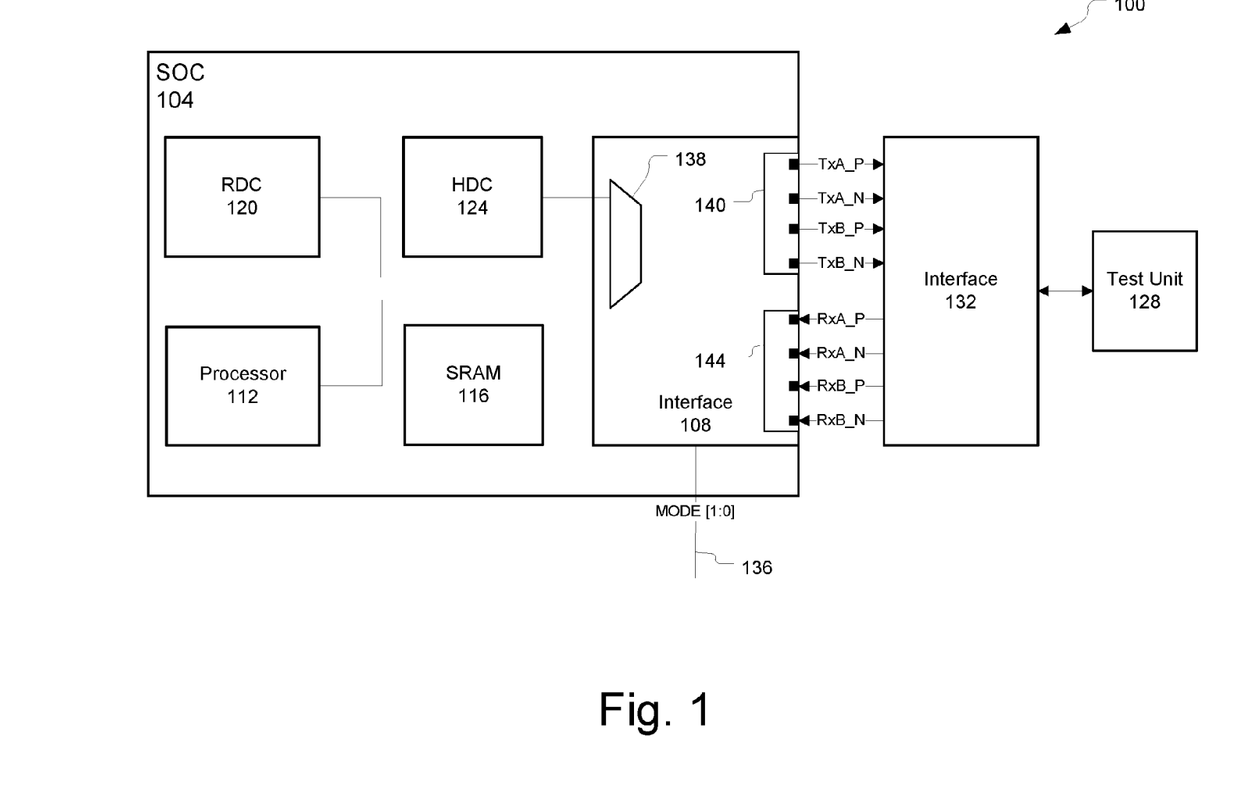
FIG. 1 illustrates a block diagram of a test system in accordance with various embodiments of the present invention.

FIG. 1 illustrates a block diagram of a test system 100 for testing a storage system-on-a-chip (SOC) 104 in accordance with various embodiments of the present invention. In some embodiments, the SOC 104 may have a serial communication interface 108 (hereinafter "interface 108"), an embedded processor block, e.g., processor 112, a memory block, e.g., static random access memory (SRAM) 116, and one or more control logic blocks, e.g., a read channel block (RDC) 120 and a hard disk controller block (HDC) 124, which may be communicatively coupled to each other at least as shown. In particular, at least the processor 112, the RDC 120, and the HDC 124 may be communicatively coupled to the interface 108 to provide an off-chip test unit 128 (hereinafter "test unit 128") communicative access to these blocks. The test unit 128 may be communicatively coupled to the SOC 104 through an off-chip serial communication interface 132 (hereinafter "interface 132").

As briefly discussed above, it may be desirable to test the blocks of the SOC 104 for reasons such as, e.g., debugging, characterizing internal operations, etc. This testing may be performed by placing the SOC 104 into an appropriate personality mode by driving a mode input 136 as desired.

The interface 108 may receive an indication of the desired personality mode as a personality mode selection signal (hereinafter "selection signal") along the mode input 136. The interface 108 may then operate in a manner consistent with the selected personality mode of the SOC 104.

In various embodiments, the SOC 104 may be placed in a normal mode, a processor mode, an HDC mode, and/or an RDC-only mode.

The normal mode may be the mode of typical operation of the SOC 104 with all of the blocks functional. The other modes may be test modes designed for testing specific operating characteristics of the blocks of the SOC 104.

The SOC 104 may be placed in the processor mode to provide processor trace data (e.g., recorded information related to the code executing on the processor 112) to the test unit 128. In essence, the processor mode may simply provide the test unit 128 a window into the executing operations of the processor 112, e.g., the code that is currently executing and the code that is in the pipeline. This information may be used by the test unit 128 for debugging and/or other diagnostic analysis.

The HDC mode may be a test mode where all of the blocks are functional except for the RDC 120. In this mode, the interface 108 may communicatively couple the operative blocks of the SOC 104, e.g., processor 112, SRAM 116, and HDC 124, to an RDC that is external to the SOC 104, e.g., on the test unit 128. This may provide an opportunity to try different RDCs in conjunction with the operative blocks of the SOC 104.

The RDC-only mode may be a test mode where the entire SOC 104 is powered down except for the RDC 120. The interface 108 may communicatively couple the RDC 120 to blocks of the test unit 128, e.g., an HDC, processor, and/or memory blocks, for testing.

The mode input 136 may allow for a selection signal, e.g. a two-bit selection signal, to be provided to the interface 108. This selection signal may originate from a controller that is external to the SOC 104, e.g., on the test unit 128. In an embodiment, the selection signal and their corresponding modes may be as follows: 00b=normal mode; 01b=RDC-only mode; 10b=HDC mode; and 11b=processor mode. However, other embodiments may include other selection signals and/or other modes.

The interface 108 may receive the selection signal and communicatively couple the appropriate blocks of the SOC 104 to the interface 132 and, subsequently, the test unit 128. In some embodiments, this selective communicative coupling may be facilitated through a multiplexor 138.

The interface between the blocks of the SOC 104 and the test unit 128 while the SOC 104 is in either the HDC mode or the RDC-only mode may be bidirectional, thereby allowing information to flow into and out of the SOC 104. While various embodiments described in further detail below may be directed towards interfacing the RDC 120 with the test unit 128, other embodiments may include interfacing other control logic blocks, e.g., HDC 124, to the test unit.

The RDC 120 may communicate with the interface 108 through a number of parallel signal lines. In an embodiment, the RDC 120 may be communicatively coupled to the interface 108 by a non-return-to-zero (NRZ) bus, which may run, e.g., up to 300 megahertz (MHz) and be ten bits wide. Additionally, various clock and control lines may also be connected between the RDC 120 and the interface 108. The interface between the RDC 120 and the interface 108, including the NRZ bus and other signal, clock, and/or control lines, may be referred to as a native RDC interface.

While the SOC 104 is in the RDC-only mode, the test unit 128 may be adapted to communicate with the RDC 120 through a complementary native RDC interface. However, providing such an interface with, e.g., 10 or more 300 MHz pads, on the SOC 104 may unduly limit the size of the SOC 104. That is, the size of the SOC 104 needed to accommodate these electrical connections may be larger than the size needed for all of the logic on the SOC 104 providing the desired functionality. This is especially true as integrated circuit logic is becoming smaller and smaller (from 60 nanometer (nm) processes to 45 nm processes and beyond). If the size of the SOC 104 were pad-limited, the SOC 104 may have unused die space, which may sometimes be referred to as whitespace.

Accordingly, in an embodiment of the present invention, the interface 108 may include serialization and/or parallelization logic to allow for interface 108 to communicate with the test unit 128 via one or more serial ports, e.g., an output serial port 140 and an input serial port 144, and the interface 132. As will be shown in further detail below, the interface 132 may have parallelization and/or serialization logic to complement similar logic found in the interface 108.

The serialization and/or parallelization logic of the interface 108 may be placed in what would otherwise be whitespace of the SOC 104. Therefore, the size of the SOC 104 may be determined by the size of the logic to provide the desired functionality rather than the size of the electrical connections, thereby facilitating a reduction in cost and/or size of the SOC 104 without sacrificing performance.

Each of the output serial port 140 and the input serial port 144 may include electrical connections configured to couple to corresponding differential transmission lines, e.g., (TxA_P, TxA_N, TxB_P, and TxB_N) and (RxA_P, RxA_N, RxB_P, and RxB_N), respectively. The differential transmission lines may communicatively couple the SOC 104 to interface 132, which may provide the test unit 128 with the native RDC interface.

Figure 2:
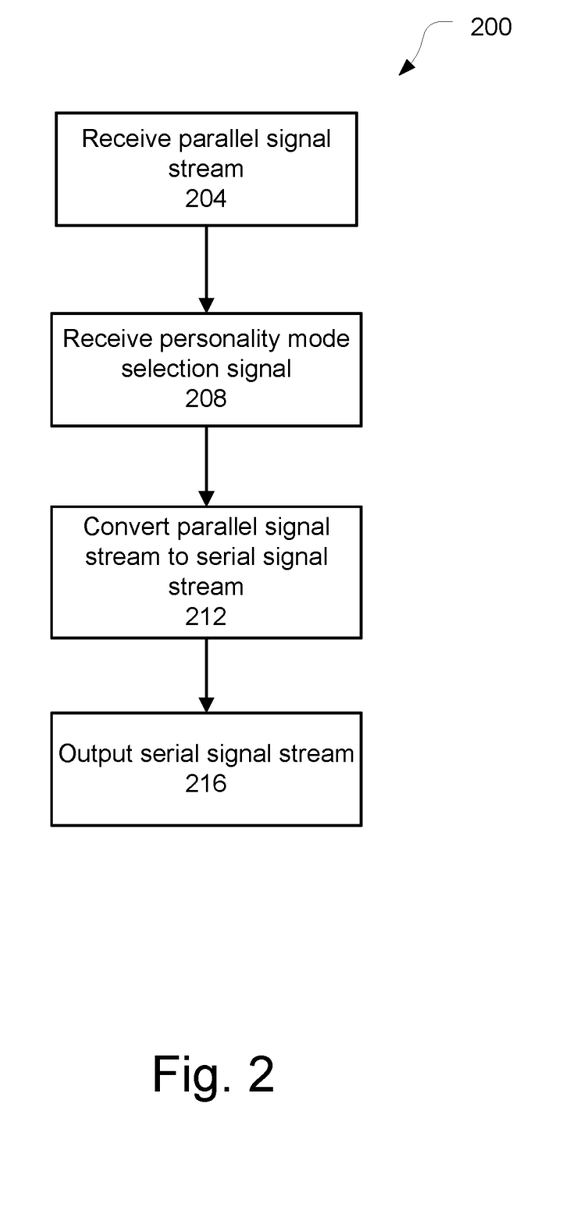
FIG. 2 illustrates a flow diagram of a serialization operation in accordance with various embodiments of the present invention.

FIG. 2 illustrates a flowchart depicting an output operation 200 of the interface 108 in accordance with an embodiment of this invention. In phase 204 the interface 108 may receive a parallel signal stream from one or more blocks to which it is communicatively coupled, e.g., the processor 112, the RDC 120, and/or the HDC 124. In phase 208 the interface 108 may also receive a selection signal on the mode input 136. Depending on the personality mode of the SOC 104, determined by the received selection signal, the interface 108 may convert a parallel signal stream from one or more selected blocks to a serial signal stream in phase 212. The interface 108 may then output the serial signal stream from the output serial port 140 in phase 216.

Figure 3:
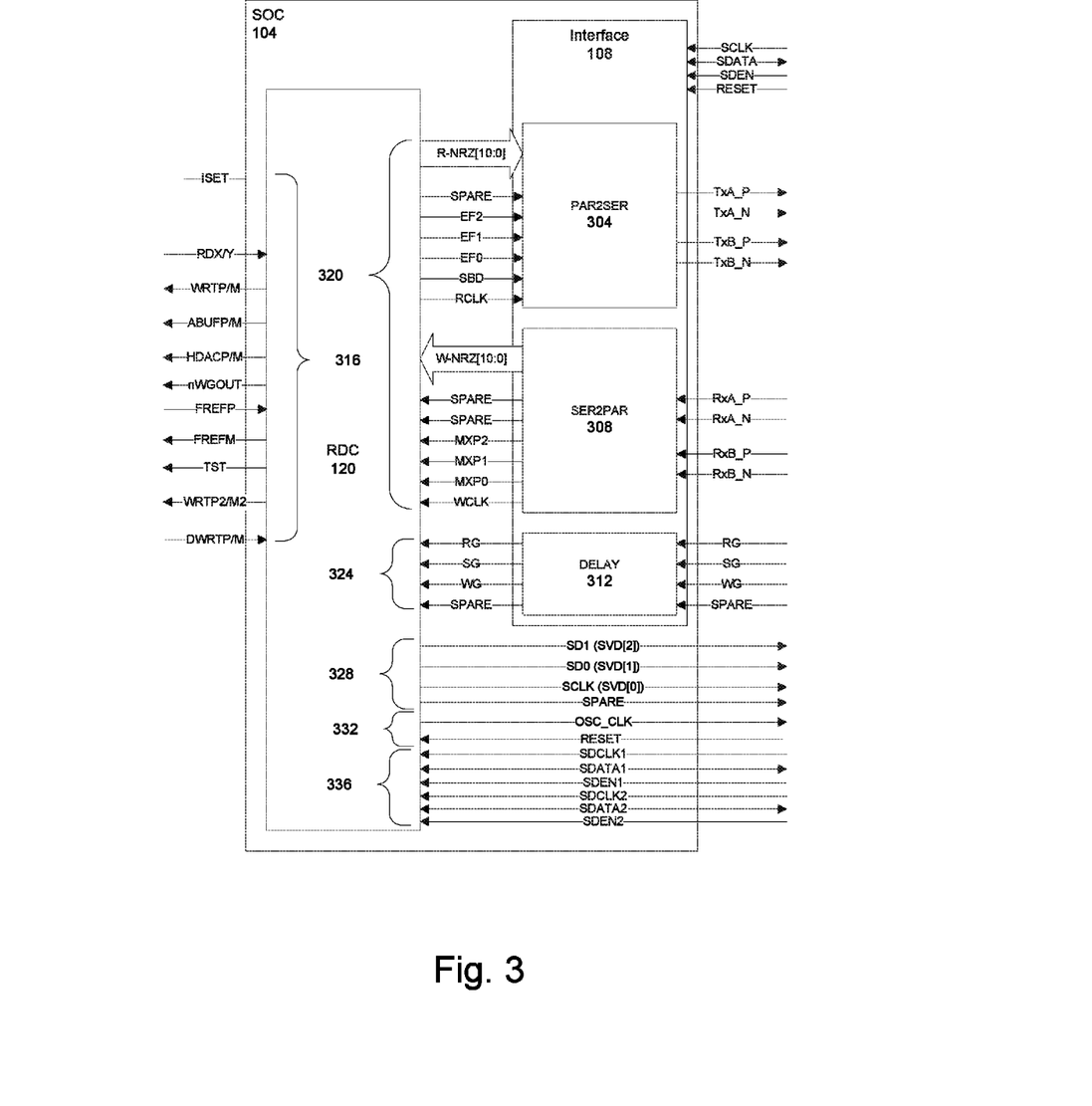
FIG. 3 illustrates a block diagram of a system on a chip in a read channel-only personality mode in accordance with various embodiments of the present invention.

FIG. 3 illustrates the SOC 104 in more detail in accordance with various embodiments of the present invention. The SOC 104, as shown in this embodiment, may be in the RDC-only personality mode with only the RDC 120 active. In this embodiment, the interface 108 may include a parallel-to-serial (PAR2SER) block 304, a serial-to-parallel (SER2PAR) block 308, and a delay 312, communicatively coupled to the RDC 120 as shown.

Figure 4:
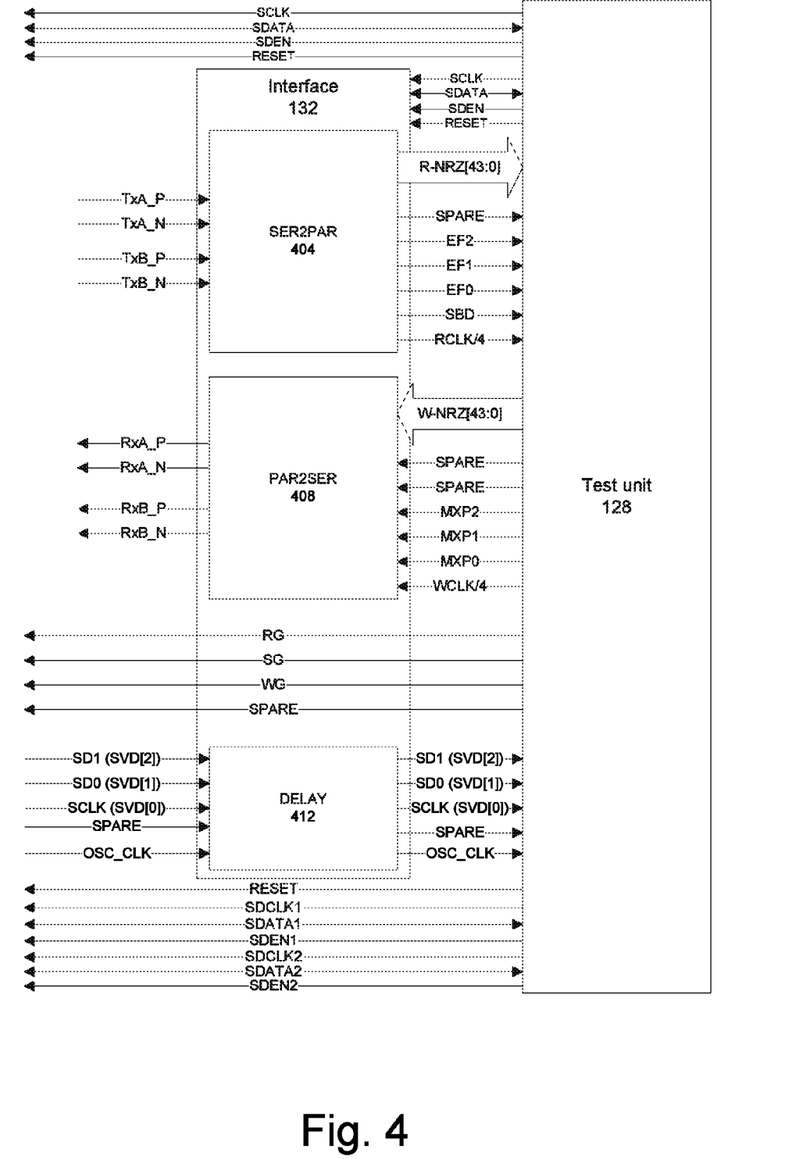
FIG. 4 illustrates a block diagram of an off-chip interface and test unit in accordance with various embodiments of the present invention.

FIG. 4 illustrates the interface 132 and test unit 128 in more detail in accordance with various embodiments of the present invention. The interface 132 shown in FIG. 4 may be configured to complement the interface 108 as shown in FIG. 3. In particular, the PAR2SER block 304 may be communicatively coupled to a complementary SER2PAR block 404 and the SER2PAR block 308 may be communicatively coupled to a complementary PAR2SER block 408.

The interface 108 may also include a delay 412. The interactions of these components may be described in further detail below.

Figure 5:
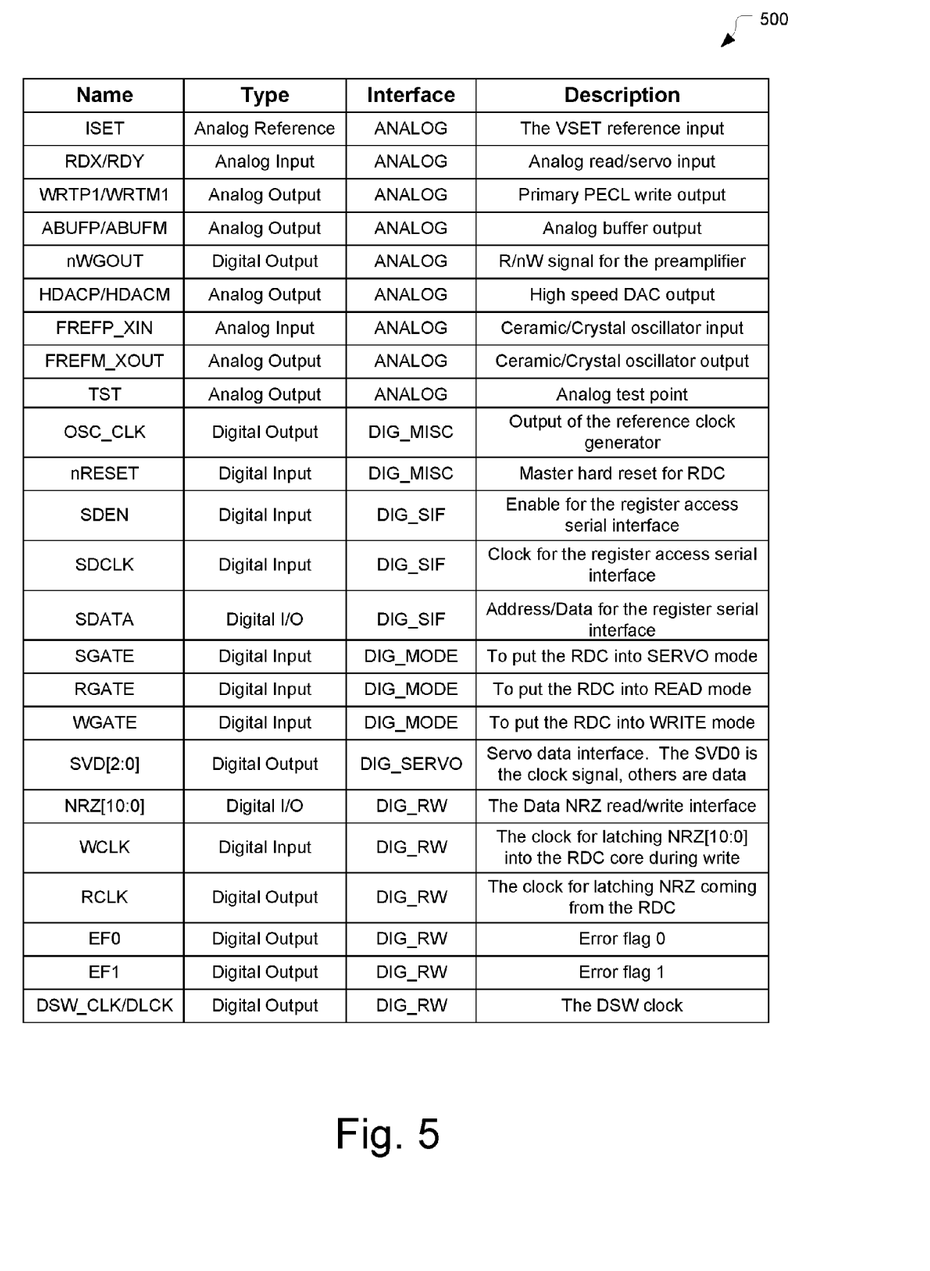
FIG. 5 illustrates a table of read channel interface signals in accordance with various embodiments of the present invention.
Figure 6:
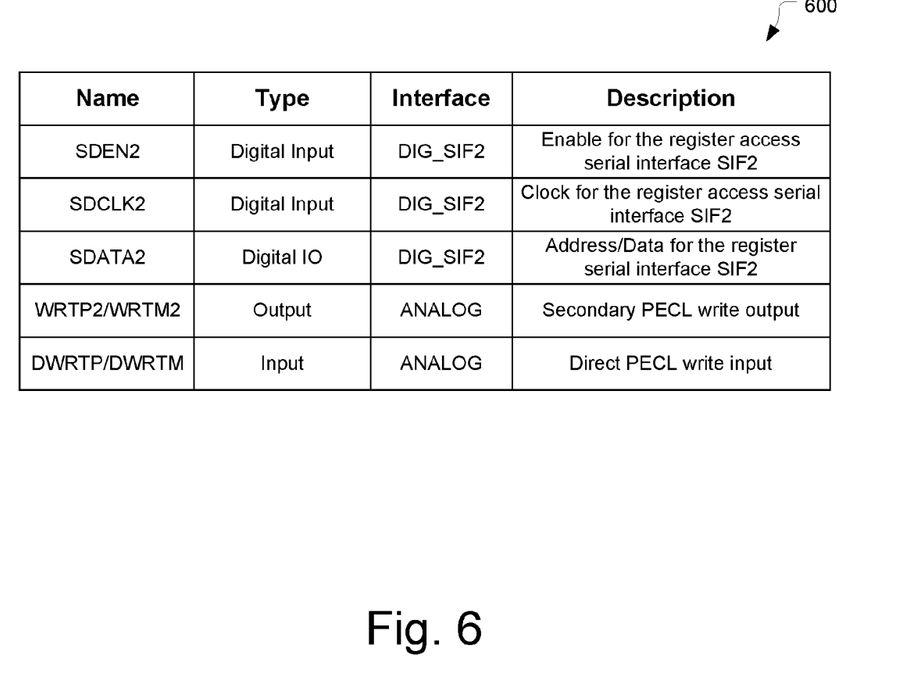
FIG. 6 illustrates another table of read channel interface signals in accordance with additional embodiments of the present invention.

A listing and brief description of the signals to and/or from the RDC 120 as shown in FIG. 3 may be found in table 500 of FIG. 5 in accordance with various embodiments of the present invention. The table 500 lists the name, type, interface, and brief description of the various signals shown in FIG. 3. In some embodiments, e.g., if the RDC 120 is an enterprise class RDC, it may also have the signals given in table 600 of FIG. 6, in accordance with various embodiments of the present invention.

As shown in FIG. 3, the signal interfaces of the RDC 120 may be as follows: ANALOG signal interface 316, DIG_RW signal interface 320, DIG_MODE signal interface 324, DIG_SERVO signal interface 328, DIG_MISC signal interface 332, and DIG_SIF signal interface 336.

In various embodiments the ANALOG signals may be routed from/to the RDC 120 to/from various components, e.g., buffers, preamplifiers, positive emitter coupled logic (PECL), oscillators, etc.

In various embodiments, at least the reset signal of the DIG_MISC signals and the DIG_SIF signals may be input to the RDC 120 from the test unit 128 via relatively low-speed digital electrical connections on the SOC 104 (compared to the relatively high-speed analog electrical connections of the input and output serial ports). Furthermore, the OSC_CLK of the DIG_MISC signals, the DIG_MODE signals, and/or the DIG_SERVO signals may also be input and/or output via relatively low-speed digital electrical connections on the SOC 104. However, instead of being routed directly between the test unit 128 and the RDC 120, these signals may be routed through the delays of the respective interfaces as will be discussed in further detail below.

In various embodiments, the output DIG_RW signals may be output from the RDC 120 to the PAR2SER block 304. These output DIG_RW signals may include a parallel signal stream having, e.g., signals from the read NRZ bus, error flags, and clock signals, provided to the interface 108. With the SOC 104 in RDC-only mode, the interface 108 may multiplex these parallel signals to the PAR2SER block 304, where the signals may be serialized into a serial signal stream for output along the transmission differential lines, e.g., Tx_P and Tx_N (the A pair and/or the B pair). The complementary SER2PAR block 404 may receive the serial signal stream transmitted over Tx_P and Tx_N, parallelize the signals, and provide the reconstituted output DIG_RW signals to the test unit 128 as the parallel signal stream of its native RDC interface.

In a similar but converse manner, the test unit 128 may transmit the input signals DIG_RW signals 320 to the PAR2SER block 408 for serialization and subsequent transmission via the reception differential lines, e.g., Rx_P and Rx_N (the A pair and/or the B pair). The complementary SER2PAR block 308 may parallelize the signals, and provide the reconstituted input DIG_RW signals to the RDC 120 as the parallel signal stream of its native RDC interface.

In various embodiments, the DIG_SERVO signals, which may include a servo data interface having two data lines and one line for clock signals, may be output from the RDC 120 to the interface 132. The interface 132 may route the DIG_SERVO signals through delay 412, which may be configured to delay the signals by an amount corresponding to the processing time of the signals passing through parallelization logic of the SER2PAR 404. The DIG_SERVO signals 328 may then be provided to the test unit 128.

In a similar but converse manner, the test unit 128 may provide DIG_MODE signals 324 to the interface 108, where they are routed through the delay 312. The delay 312 may be configured to delay the signals by an amount corresponding to the processing time of the signals passing through the parallelization logic of the SER2PAR block 308.

In various embodiments, the serialization and parallelization logic of the interfaces 108 and 132 may communicate with complementary logic at a fixed frequency. Accordingly, in these embodiments, these blocks may include a phase-locked loop (PLL) programmed to the desired rate of transfer, e.g., 3 GHz. The PLLs may be programmed through using the DIG_SIF signals.

Figure 7:
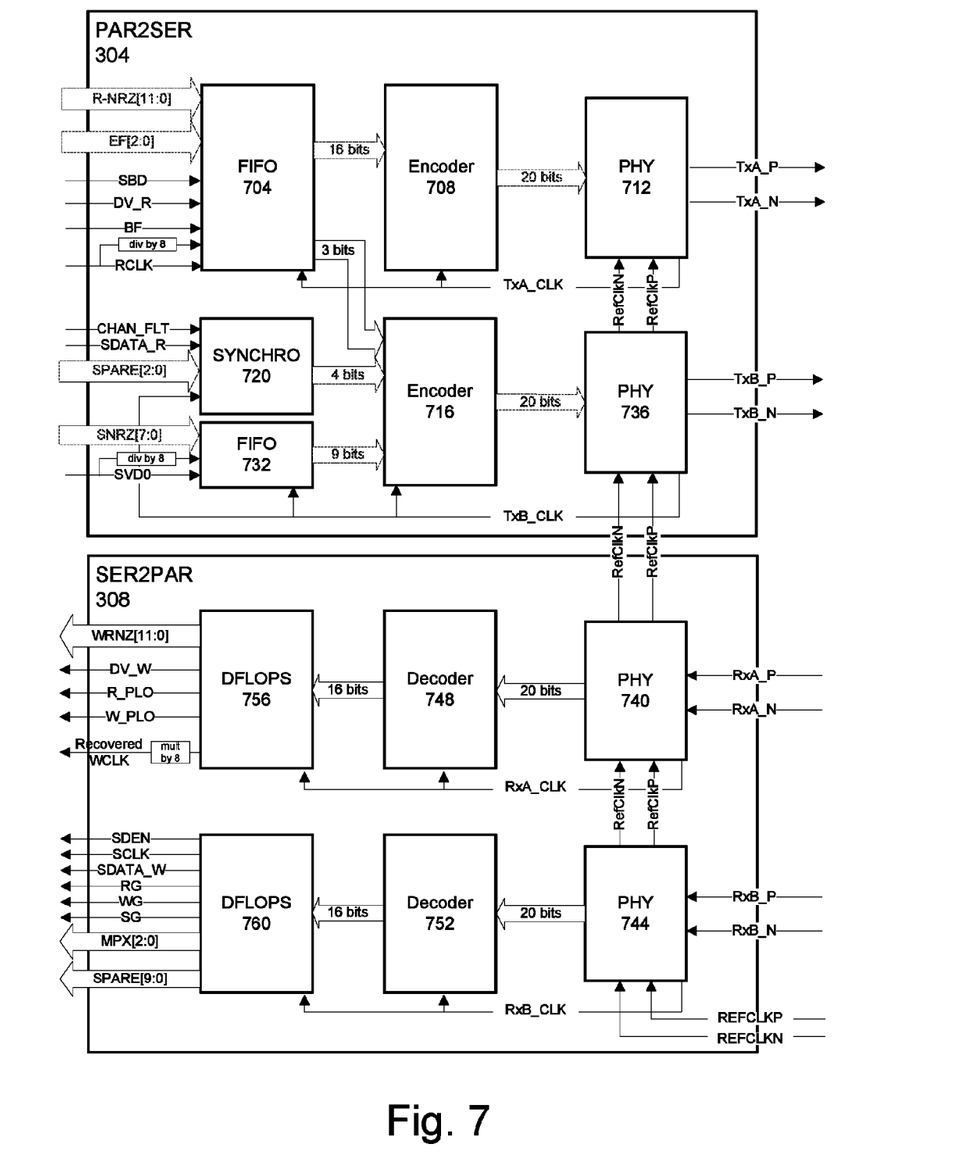
FIG. 7 illustrates a block diagram of an on-chip interface in accordance with various embodiments of the present invention.

FIG. 7 illustrates the PAR2SER block 304 and the SER2PAR block 308 in more detail in accordance with various embodiments of the present invention. In particular, the serialization and parallelization circuitry may be shown in this figure with greater specificity in accordance with various embodiments. While the circuitry shown and described with reference to this embodiment is one example of circuitry to effectuate the embodiments of the invention discussed above, other circuitry may additionally/alternatively be employed.

The PAR2SER block 304 may receive the parallel signal stream from the interface 108. A first stream including, e.g., read NRZ signals, error flag signals, a read clock, etc., may be directed into a buffer, e.g., first-in, first-out (FIFO) buffer 704. The FIFO buffer 704 may transmit a sixteen-bit signal to an encoder 708, which may be, e.g., a dual eight bit: ten-bit encoder, for encoding. Subsequent to encoding, the encoder 708 may transmit the resulting twenty-bit signal to a physical layer device (PHY) 712, which may be, e.g., a six gigabits per second (Gbps) transmission PHY. The PHY 712 may modulate the signal to effect transmission of serial signal stream via the pair of differential output lines, e.g., TxA_P and TxA_N. The FIFO buffer 704 may also transmit a three-bit signal to an encoder 716, which may be similar to encoder 708.

A second stream including, e.g., a read SDATA signal, servo NRZ signals, control signals, servo data clock signal, etc., may be presented to a synchronizer 720 and another FIFO buffer 732 substantially as shown. The synchronizer 720 may provide a four-bit signal to the encoder 716 and the FIFO buffer 732 may provide a nine-bit signal to the encoder 716. Subsequent to encoding, the encoder 716 may output a twenty-bit signal to a PHY 736, which may be similar to PHY 712. The PHY 736 may modulate the signals for transmission of a serial stream via a second pair of differential output lines, e.g., TxB_P and TxB_N. Note that this embodiment includes two pairs of differential output lines; however, other embodiments may have any number of pairs.

The local differential signaling scheme employed by the PHYs 712 and 736 in various embodiments may facilitate high speed signaling, e.g., in the 4-6 GHz range. This may avoid the prior art challenges of providing a digital electrical connection that is large enough to support the desired signaling frequency.

Figure 8:
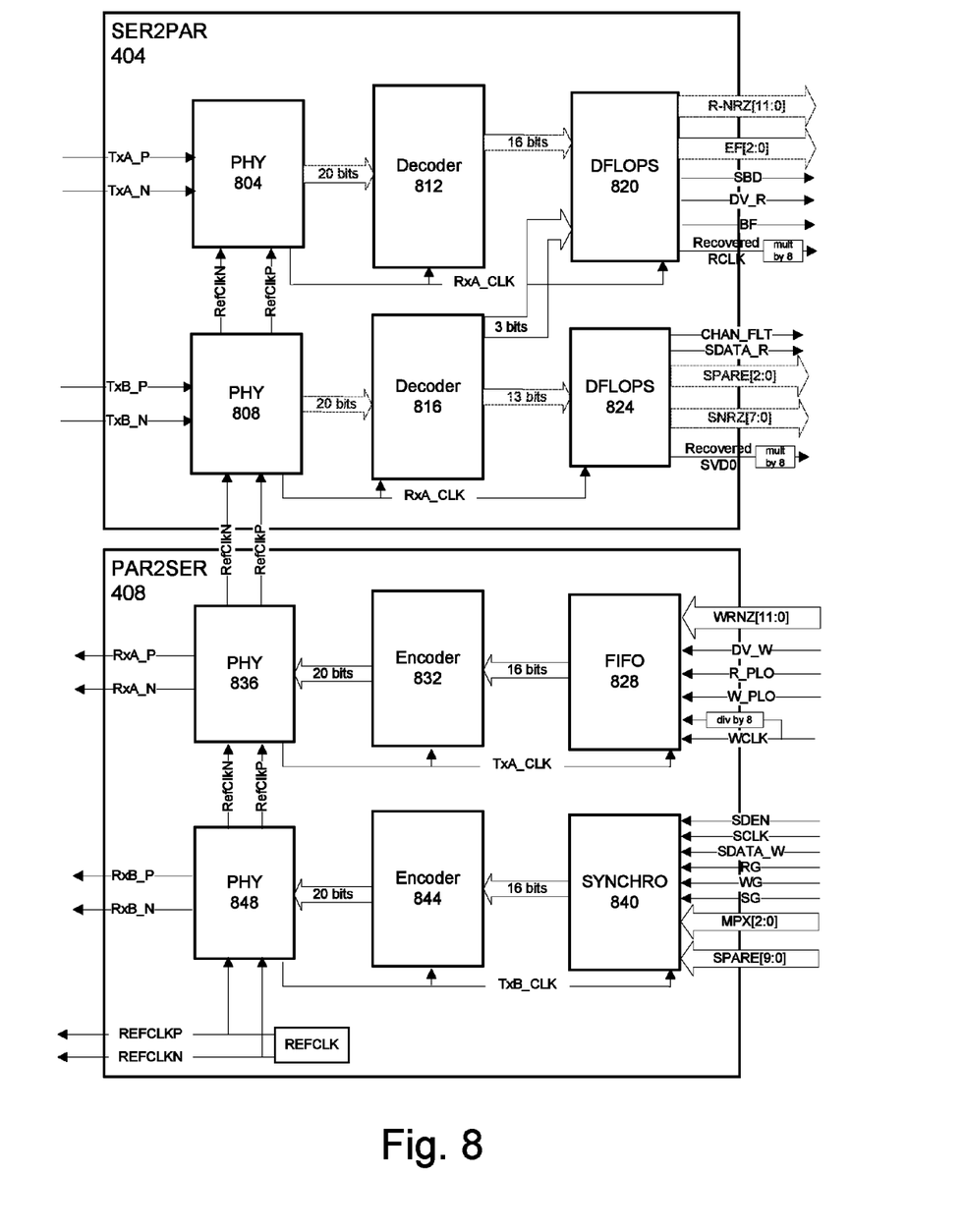
FIG. 8 illustrates a block diagram of an off-chip interface in accordance with various embodiments of the present invention.

Referring now to FIG. 8, there is shown the SER2PAR block 404 and the PAR2SER block 408 in more detail in accordance with various embodiments of the present invention. In particular, the serialization and parallelization circuitry is shown in this figure with greater specificity and as a complement to the embodiment depicted in FIG. 7, in accordance with various embodiments of the present invention.

The SER2PAR block 404 may include PHYs 804 and 808 to complement PHYs 712 and 736, respectively, and decoders 812 and 816 to complement encoders 708 and 716, respectively.

In this embodiment, the PHY 804 may receive a first serial stream over the first pair of differential lines, TxA_P and TxA_N, demodulate the received signals and transmit a twenty-bit demodulated signal to the decoder 812. The decoder 812 may then decode the signal and transmit the decoded sixteen-bit signal to a latch, e.g., D-type flip flops (DFLOPS) 820 that may be used to pipeline the signal to allow a full clock cycle for data leaving the SER2PAR unit 404.

The PHY 808 may receive a second serial stream over the second pair of differential lines, TxB_P and TxB_N, demodulate the received signals and transmit a twenty-bit demodulated signal to the decoder 816. The decoder 816 may decode the signal and transmit a decoded three-bit signal to DFLOPS 820 and a decoded thirteen-bit signal to DFLOPS 824. The DFLOPS 820 and 824 may latch the signals back into a parallel format that provide the native RDC interface for the test unit 128.

In various embodiments the PAR2SER block 408 may have circuitry such as a FIFO buffer 828, an encoder 832, and a PHY 836, communicatively coupled to one another as shown to serialize a first stream of signals received in parallel from the test unit 128 and output the signals in a serial stream over a first pair of differential lines, e.g., RxA_P and RxA_N.

The PAR2SER block 408 may also have circuitry such as a synchronizer 840, an encoder 844, and a PHY 848, communicatively coupled to one another as shown to serialize a second stream of signals received in parallel from the test unit 128 and output the signals in a serial stream over a second pair of differential lines, e.g., RxB_P and RxB_N. Again, while two pairs of differential lines are shown in this embodiment, other embodiments may have other numbers of pairs.

The components of the PAR2SER block 408 may be similar to like-name components of the PAR2SER block 304 described above.

Referring once again to FIG. 7, the SER2PAR block 308 may include PHYs 740 and 744 to complement PHYs 836 and 848, respectively, and decoders 748 and 752 to complement encoders 832 and 844, respectively.

In this embodiment, the PHY 740 may receive the first serial stream over the first pair of differential lines, RxA_P and RxA_N, demodulate the received signals, and transmit a twenty-bit demodulated signal to the decoder 748. The decoder 748 may, subsequent to decoding the received signal, transmit a sixteen-bit decoded signal to a latch, e.g., DFLOPS 756. The DFLOPS 756 may latch the signals back into the parallel format that provides the native RDC interface for the RDC 120.

The parallelization of the second serial stream received via the second pair of differential lines, e.g., RxB_P and RxB_N, may be done through the PHY 744, decoder 752, and DFLOPS 760 in a manner similar to the parallelization of the first serial stream through the PHY 740, decoder 748, and DFLOPS 756.

While FIGS. 7 and 8 may illustrate certain signals, e.g., read gate (RG), servo gate (SG), and write gate (WG) signals, being directed through PAR2SER block 408 and SER2PAR block 308 other embodiments, e.g., those shown and discussed with reference to FIGS. 3 and 4, may have these and/or other signals being transmitted in parallel to the differential transmission lines.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present invention. This application is intended to cover any adaptations or variations of the embodiment discussed herein. Therefore, it is manifested and intended that the invention be limited only by the claims and the equivalents thereof.

What is claimed is:

1. A system-on-a-chip (SOC) comprising:
   a processor block;
   a read channel block;
   a hard disk controller block; and
   a first interface configured to communicate with a test unit via a second interface, wherein each of the test unit and the second interface is external to the SOC,
   wherein based on a selection signal, the SOC is configured to operate, at a given time, in one of (i) a first mode that represents a normal operational mode of the SOC, (ii) a second mode that represents a processor mode for testing the SOC, (iii) a third mode that represents a hard disk controller mode for testing the SOC, or (iv) a fourth mode that represents a read channel only mode for testing the SOC,
   wherein while the SOC operates in the first mode, (i) each of the processor block, the read channel block and the hard disk controller block are functional, and (ii) the SOC does not communicate with the test unit,
   wherein while the SOC operates in the second mode, the processor block is configured to transmit data to the test unit via the first interface and the second interface,
   wherein while the SOC operates in the third mode, (i) the read channel block is non-functional, and (ii) one or both of the processor block and the hard disk controller block is configured to transmit data to the test unit via the first interface and the second interface, and
   wherein while the SOC operates in the fourth mode, (i) the read channel block is functional, (ii) the processor block and the hard disk controller block are non-functional, and (iii) the read channel block is configured to transmit data to the test unit via the first interface and the second interface.

2. The SOC of claim 1, wherein the selection signal is received by the SOC from the test unit.

3. The SOC of claim 1, wherein the first interface comprises:
   a multiplexer configured to (i) receive data from each of the processor block, the read channel block, and the hard disk controller block, and (ii) based on a mode in which the SOC is operating, selectively output data from one of the processor block, the read channel block, and the hard disk controller block.

4. The SOC of claim 1, wherein the first interface comprises:
   a parallel-to-serial block configured to (i) based on the selection signal, receive parallel data from one of the processor, the hard disk controller block, or the read channel block, (ii) convert the parallel data to serial data, and (iii) transmit the serial data to the test unit via the second interface.

5. The SOC of claim 1, wherein the first interface comprises:
   a serial-to-parallel block configured to (i) receive serial data from the test unit via the second interface, (ii) convert the serial data to parallel data, and (iii) based on the selection signal, transmit the parallel data to one of the processor, the hard disk controller block, or the read channel block.

6. The SOC of claim 5, wherein the first interface further comprises:
a delay module configured to (i) receive first data from the test unit via the second interface, (ii) based on the selection signal, transmit the first data to one of the processor, the hard disk controller block, or the read channel block, and (iii) subsequent to receiving the first data, delay the transmission of the first data to one of the processor, the hard disk controller block, or the read channel block by a delay amount.

7. The SOC of claim 6, wherein the delay amount accounts for a time taken to convert the serial data to the parallel data by the serial-to-parallel block.

8. The SOC of claim 1, further comprising:
one or more digital pins configured to transmit and receive signals,
wherein the selection signal is configured to alter a definition of the one or more digital pins.

9. The SOC of claim 1, wherein:
the read channel block is a first read channel block;
while the SOC operates in the third mode, a second read channel block (i) is communicatively coupled to the SOC and (ii) mimics the operation of the non-functional first read channel block; and
the second read channel block is external to the SOC.

10. A method of operating a system-on-a-chip (SOC) comprising (i) a processor block, (ii) a read channel block, (iii) a hard disk controller block, and (iv) a first interface, the method comprising:
communicating, by the first interface, with a test unit via a second interface, wherein each of the test unit and the second interface is external to the SOC;
receiving, by the SOC, a selection signal;
based on the selection signal, receiving, by a parallel-to-serial block included in the first interface, parallel data from one of the processor, the hard disk controller block, or the read channel block;
converting, by the parallel-to-serial block, the parallel data to serial data; and
transmitting, by the parallel-to-serial block, the serial data to the test unit via the second interface; and
based on the selection signal, operating, by the SOC, at a given time, in one of (i) a first mode, (ii) a second mode, (iii) a third mode, or (iv) a fourth mode,
wherein while the SOC operates in the first mode, (i) each of the processor block, the read channel block and the hard disk controller block are functional, and (ii) the SOC does not communicate with the test unit,
wherein while the SOC operates in the second mode, the processor block is configured to transmit data to the test unit via the first interface and the second interface,
wherein while the SOC operates in the third mode, (i) the read channel block is non-functional, and (ii) one or both of the processor block and the hard disk controller block is configured to transmit data to the test unit via the first interface and the second interface, and
wherein while the SOC operates in the fourth mode, (i) the read channel block is functional, (ii) the processor block and the hard disk controller block are non-functional, and (iii) the read channel block is configured to transmit data to the test unit via the first interface and the second interface.

11. The method of claim 10, wherein receiving the selection signal comprises:

receiving the selection signal from the test unit.

12. The method of claim 10, wherein the read channel block is a first read channel block, and wherein the method further comprises:
while the SOC operates in the third mode, communicating, by the SOC, with a second read channel block that (i) mimics the operation of the non-functional first read channel block and (ii) is external to the SOC.

13. A method of operating a system-on-a-chip (SOC) comprising (i) a processor block, (ii) a read channel block, (iii) a hard disk controller block, and (iv) a first interface, the method comprising:
communicating, by the first interface, with a test unit via a second interface, wherein each of the test unit and the second interface is external to the SOC;
receiving, by the SOC, a selection signal;
receiving, by a serial-to-parallel block included in the first interface, serial data from the test unit via the second interface;
converting, by the serial-to-parallel block, the serial data to parallel data; and
based on the selection signal, transmitting, by the serial-to-parallel block, the parallel data to one of the processor, the hard disk controller block, or the read channel block; and
based on the selection signal, operating, by the SOC, at a given time, in one of (i) a first mode, (ii) a second mode, (iii) a third mode, or (iv) a fourth mode,
wherein while the SOC operates in the first mode, (i) each of the processor block, the read channel block and the hard disk controller block are functional, and (ii) the SOC does not communicate with the test unit,
wherein while the SOC operates in the second mode, the processor block is configured to transmit data to the test unit via the first interface and the second interface,
wherein while the SOC operates in the third mode, (i) the read channel block is non-functional, and (ii) one or both of the processor block and the hard disk controller block is configured to transmit data to the test unit via the first interface and the second interface, and
wherein while the SOC operates in the fourth mode, (i) the read channel block is functional, (ii) the processor block and the hard disk controller block are non-functional, and (iii) the read channel block is configured to transmit data to the test unit via the first interface and the second interface.

14. The method of claim 13, further comprising:
receiving, by a delay module included in the first interface, first data from the test unit via the second interface;
based on the selection signal, transmitting, by the delay module, the first data to one of the processor, the hard disk controller block, or the read channel block; and
subsequent to receiving the first data, delaying, by the delay module, the transmission of the first data to one of the processor, the hard disk controller block, or the read channel block by a delay amount.

15. The method of claim 14, wherein the delay amount accounts for a time taken to convert the serial data to the parallel data by the serial-to-parallel block.

16. The method of claim 13, wherein the read channel block is a first read channel block, and wherein the method further comprises:
while the SOC operates in the third mode, communicating, by the SOC, with a second read channel block that (i) mimics the operation of the non-functional first read channel block and (ii) is external to the SOC.

17. The method of claim 13, wherein:
the first mode is a normal operational mode of the SOC;
the second mode is a processor mode for testing the SOC;
the third mode is a hard disk controller mode for testing the SOC; and
the fourth mode is a read channel only mode for testing the SOC.

18. The method of claim 13, wherein receiving the selection signal comprises:
receiving the selection signal from the test unit.

19. The method of claim 10, wherein:
the first mode is a normal operational mode of the SOC;
the second mode is a processor mode for testing the SOC;
the third mode is a hard disk controller mode for testing the SOC; and
the fourth mode is a read channel only mode for testing the SOC.

\* \* \* \* \*